United States Patent
Shinohara

(10) Patent No.: US 12,230,722 B2
(45) Date of Patent: Feb. 18, 2025

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 727 days.

(21) Appl. No.: 16/926,405

(22) Filed: Jul. 10, 2020

(65) Prior Publication Data

US 2021/0020793 A1    Jan. 21, 2021

(30) Foreign Application Priority Data

Jul. 19, 2019  (JP) .................... 2019-133789

(51) Int. Cl.
| | |
|---|---|
| H01L 31/02 | (2006.01) |
| G01J 1/44 | (2006.01) |
| H01L 27/146 | (2006.01) |
| H01L 31/107 | (2006.01) |
| H04N 25/773 | (2023.01) |

(52) U.S. Cl.
CPC ......... *H01L 31/02027* (2013.01); *G01J 1/44* (2013.01); *H01L 27/14643* (2013.01); *H01L 31/107* (2013.01); *H04N 25/773* (2023.01); *G01J 2001/442* (2013.01)

(58) Field of Classification Search
CPC ......... H01L 31/02027; H01L 27/14643; H01L 31/107; G01J 1/44; G01J 2001/442; H04N 25/773; H04N 25/772
See application file for complete search history.

(56) References Cited

U.S. PATENT DOCUMENTS

| | | | |
|---|---|---|---|
| 10,841,518 B2* | 11/2020 | Nishihara | ............... G01J 1/44 |
| 2008/0290259 A1 | 11/2008 | Mathewson | |
| 2014/0124652 A1 | 5/2014 | Dutton et al. | |
| 2018/0197905 A1 | 7/2018 | Sakata | |
| 2018/0246214 A1 | 8/2018 | Ishii | |
| 2020/0091214 A1* | 3/2020 | Ikeda | ................... G06N 3/045 |
| 2020/0106982 A1* | 4/2020 | Kasuga | ............. H01L 27/14612 |
| 2021/0051279 A1* | 2/2021 | Tochigi | ............. H01L 27/14643 |

FOREIGN PATENT DOCUMENTS

| | | |
|---|---|---|
| JP | 2019-009768 A | 1/2019 |
| JP | 2019102618 A | 6/2019 |
| WO | 2017/098725 A1 | 6/2017 |
| WO | 2018/216400 A1 | 11/2018 |
| WO | 2018/224910 A1 | 12/2018 |

* cited by examiner

*Primary Examiner* — Albert H Cutler
(74) *Attorney, Agent, or Firm* — CANON U.S.A., INC. IP DIVISION

(57) ABSTRACT

According to an aspect of the present disclosure, an avalanche diode, a detection unit configured to detect an avalanche current generated by avalanche multiplication in the avalanche diode, a switch disposed between the avalanche diode and the detection unit, and a reset unit configured to reset a node between the switch and the detection unit. The reset unit resets the node during a period in which the switch is in an off state.

14 Claims, 13 Drawing Sheets

FIG.11B
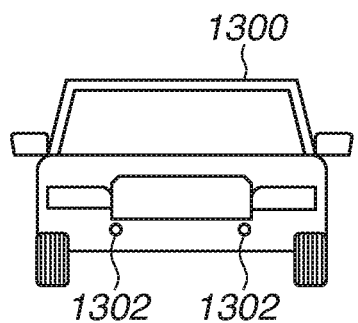
FRONT VIEW
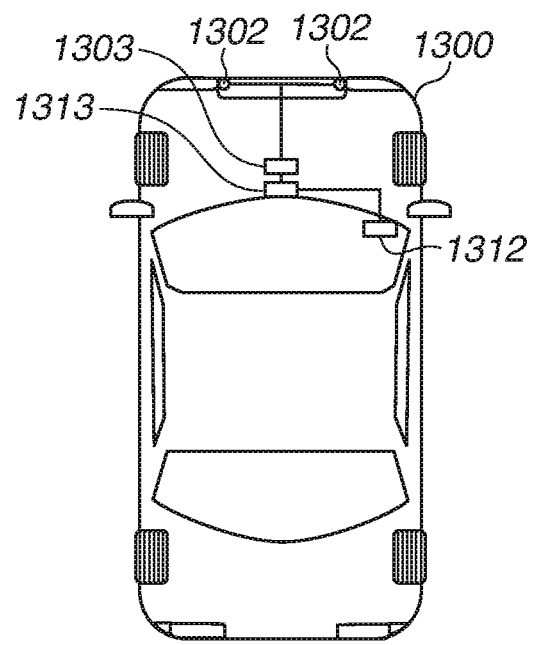
TOP VIEW
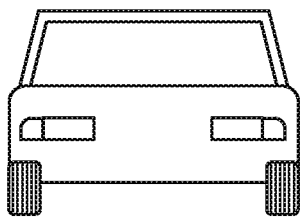
REAR VIEW

PHOTOELECTRIC CONVERSION APPARATUS, PHOTOELECTRIC CONVERSION SYSTEM, AND MOVING BODY

BACKGROUND

Field

The present disclosure relates to a photoelectric conversion apparatus, a photoelectric conversion system, and a moving body.

Description of the Related Art

The development of image sensors in which a single photon avalanche diode (SPAD) is used for each pixel has been accelerated. In image sensors using the SPAD, avalanche multiplication is caused by a single signal carrier generated by a single incident photon, and thus a high voltage is required. Accordingly, a larger power consumption than that in a complementary metal oxide semiconductor (CMOS) sensor is needed.

Japanese Patent Application Laid-Open No. 2019-009768 discusses an image capturing device including an avalanche diode, a quench element, an inverter, and a counter. In the image capturing device discussed in Japanese Patent Application Laid-Open No. 2019-009768, if a count value of the counter is less than a threshold, the avalanche diode operates in Geiger mode. If the count value of the counter reaches the threshold, the avalanche diode is set to non-Geiger mode. With this configuration, the image capturing device discussed in Japanese Patent Application Laid-Open No. 2019-009768 can reduce or prevent power consumption.

According to the configuration discussed in Japanese Patent Application Laid-Open No. 2019-009768, power consumption can be reduced to some extent. However, if the number of incident photons per unit time is extremely large, pulse pileup effects (hereinafter simply referred to as pileup) may occur. The term "pileup" refers to a state where photons are sequentially incident, with the result that count pulses output from the inverter disposed between an avalanche diode (AD) and the counter are kept at a certain level. Accordingly, even in a state where a current continuously flows to the AD in each pixel in which the pileup occurs, photons are not counted as in a state where no photons are incident. As a result, the count value does not reach a predetermined count value in a high illuminance state. This leads to an increase in wasteful power consumption in the photoelectric conversion apparatus.

If the pileup occurs, the number of incident photons cannot be accurately counted. In addition, if the incident rate of photons exceeds a certain level, the pileup state lasts longer as the number of incident photons increases, so that the count number decreases. Accordingly, there is a large difference between obtained signal information and an actual signal. Specifically, a phenomenon occurs in which photoelectric conversion characteristics become nonlinear and further degradation in output is caused in a higher illuminance state.

SUMMARY

According to an aspect of the present disclosure, a photoelectric conversion apparatus includes an avalanche diode, a detection unit configured to detect an avalanche current generated by avalanche multiplication in the avalanche diode, a switch disposed between the avalanche diode and the detection unit, and a reset unit configured to reset a node between the switch and the detection unit. The reset unit resets the node during a period in which the switch is in an off state.

Further features of the present disclosure will become apparent from the following description of exemplary embodiments with reference to the attached drawings.

BRIEF DESCRIPTION OF THE DRAWINGS

FIGS. 11A and 11B are schematic diagrams each illustrating a photoelectric conversion system and a moving body according to a seventh exemplary embodiment.

DESCRIPTION OF THE EMBODIMENTS

Figure 1:
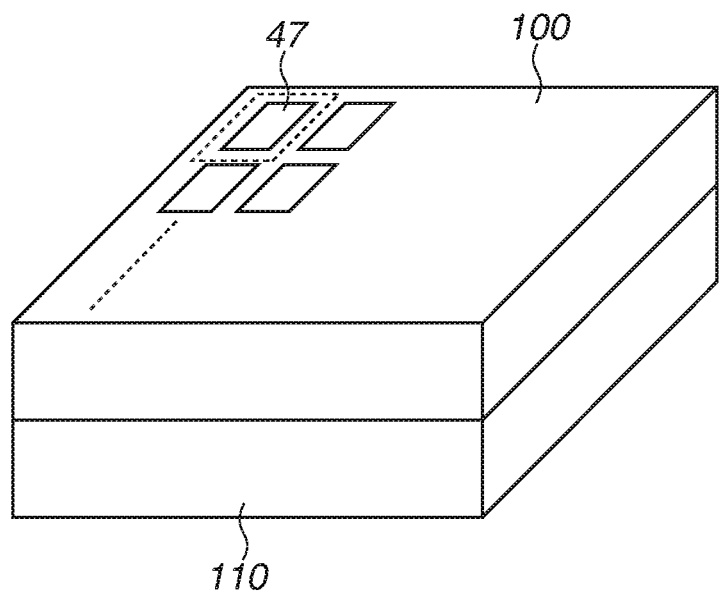
FIG. 1 is a schematic diagram illustrating a photoelectric conversion apparatus.

The following exemplary embodiments merely exemplify configurations to embody the technical idea of the present disclosure, and are not intended to limit the scope of the present disclosure. Some of the sizes and positional relationships of members illustrated in the drawings are exaggerated to clarify the description. In the following description, the same components are denoted by the same reference numerals, and descriptions thereof are omitted as appropriate.

The following exemplary embodiments relate particularly to a photoelectric conversion apparatus including a single photon avalanche diode (SPAD) that counts the number of photons incident on an avalanche diode. The photoelectric conversion apparatus includes at least an avalanche photodiode (hereinafter referred to as APD), a detection unit or a detector that detects generation of an avalanche current, and a photoelectric conversion unit including a reset unit. A reset unit is a device that resets a connection point to a pre-defined state (e.g., voltage level) upon receiving a reset control signal. An example of a reset unit is a transistor having a gate input connected to a reset control signal. The term "photoelectric conversion unit" used herein refers to a pixel in the case of an image capturing device. However, the application of the exemplary embodiments of the present disclosure is not limited to the image capturing device, and thus, the term "photoelectric conversion unit" is used.

In the following exemplary embodiments, the photoelectric conversion apparatus is formed by two-dimensionally arranging a plurality of photoelectric conversion units 47 as illustrated in FIG. 1. However, the present disclosure is also applicable to a case where the photoelectric conversion apparatus includes a single photoelectric conversion unit. As illustrated in FIG. 1, the photoelectric conversion apparatus has a configuration in which a substrate 100 is stacked on a substrate 110. The substrate 100 includes at least the APD, and the substrate 110 includes the detection unit.

The following exemplary embodiments illustrate an example where an anode of the APD is set to a fixed potential and a signal is taken out from a cathode of the APD. However, the present disclosure is not limited only to this example, but is also applicable to a case where the cathode of the APD is set to a fixed potential and a signal is taken out from the anode of the APD.

In the following description, a state where a switch is in an on state indicates a conductive state where one node of the switch is electrically connected to the other node of the switch, and a state where the switch is in an off state indicates a non-conductive state where one node of the switch is not electrically connected to the other node of the switch.

Figure 2:
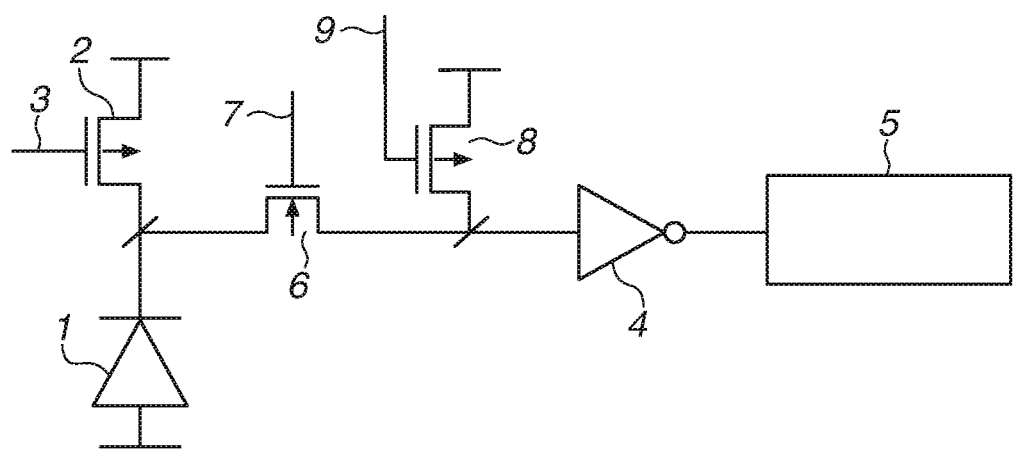
FIG. 2 is an equivalent circuit diagram illustrating a photoelectric conversion unit according to a first exemplary embodiment.

A first exemplary embodiment of the present disclosure will be described below. FIG. 2 is an equivalent circuit diagram illustrating a photoelectric conversion unit according to the present exemplary embodiment. The photoelectric conversion unit includes an APD 1, a detection unit 4 that is connected to an output node of the APD 1, a switch 6 that is disposed between the output node of the APD 1 and an input node of the detection unit 4, and a reset unit 8 that is disposed between the switch 6 and the detection unit 4. The switch 6 electrically connects (by being in ON state) or electrically disconnects (by being in OFF state) the connection between the output node of the APD 1 and an input node of the detection unit 4 according to the control line 7. The reset unit 8 resets a potential of the input node of the detection unit 4. A reset unit resets a potential of a node by connecting the node to a pre-defined potential level. Specifically, in the example illustrated in FIG. 2, the reset unit 8 resets a node between the switch 6 and the detection unit 4. In the example illustrated in FIG. 2, the photoelectric conversion unit further includes a second reset unit 2 that is connected to the cathode of the APD 1 and resets a potential of the cathode of the APD 1, and a counter 5 that counts the number of output pulses from the detection unit 4. The second reset unit 2 includes a P-type metal oxide semiconductor (MOS) transistor. The gate of the second reset unit 2 is connected to a control line 3. The switch 6 is connected to a control line 7 for controlling turning on and off of the switch 6. The reset unit 8 is connected to a control line 9 for controlling turning on and off of the reset unit 8.

The anode of the APD 1 is fixed to, for example, a negative potential of about −20 V. The node on the cathode side of the APD 1 is connected to the drain of the P-type MOS transistor constituting the second reset unit 2. The source of the P-type MOS transistor constituting the second reset unit 2 and the source of a P-type MOS transistor constituting the reset unit 8 are each connected to a power supply node (voltage VDD). The switch 6 is connected to the node (output node) on the cathode side of the APD 1.

The second reset unit 2 is operated as a quench resistive element. The gate of the P-type MOS transistor constituting the second reset unit 2 is supplied with a constant potential at which the MOS transistor has a desired ON resistance Ron through the control line 3. When a photon is incident on the APD 1, a plurality of electrons (and positive holes) is generated due to an avalanche phenomenon and the electrons are multiplied, so that a photocurrent is generated. When the photocurrent flows to the cathode of the APD 1 and the second reset unit 2, the potential of the cathode decreases due to a voltage drop caused by the resistance Rom, which prevents the avalanche phenomenon from occurring in the APD 1. In other words, an operating region of the APD 1 falls outside of Geiger mode. After that, the voltage VDD is supplied to the cathode of the APD 1 via the second reset unit 2, and thus the voltage to be supplied to the cathode of the APD 1 is returned to the voltage VDD. That is, the operating region of the APD 1 is set to Geiger mode again. If the avalanche phenomenon occurs in the APD 1, the quench resistive element is reset to the Geiger mode again from a non-Geiger mode.

The switch 6 controls an electrical continuity between the output node of the APD 1 and the input node of the detection unit 4. The switch 6 includes, for example, an N-type MOS transistor. Turning on and off of the MOS transistor included in the switch 6 is controlled by changing the voltage to be applied to the gate of the transistor through the control line 7.

The reset unit 8 is disposed between the switch 6 and the input node of the detection unit 4, and resets the potential of the input node of the detection unit 4. More specifically, when a predetermined potential is supplied to the gate of the P-type MOS transistor included in the reset unit 8, the reset unit 8 is turned on and the voltage to be supplied to the detection unit 4 via the reset unit 8 reaches the voltage VDD.

The detection unit 4 detects the presence or absence of an avalanche current generated due to the avalanche phenomenon, and generates pulses based on the presence or absence of the avalanche current. More specifically, the detection unit 4 is composed of an inverter or a comparator. In the example illustrated in FIG. 2, the detection unit 4 is an inverter having a predetermined threshold voltage value. Rectangular pulses output from the detection unit 4 are input to the counter 5.

The counter 5 counts the number of pulses output from the detection unit 4, and stores the accumulated count value. As a result, the counter 5 counts the number of generation times of the avalanche current generating based on the presence or absence of an incident photon.

Next, an operation of the photoelectric conversion unit illustrated in FIG. 2 will be described.

A state where a potential Vc of the cathode of the APD 1 is set to the voltage VDD indicates a state where the avalanche phenomenon may occur, i.e., an avalanche active state. More specifically, before a photon is incident on the APD 1, the potential Vc of the cathode of the APD 1 is set to the potential voltage VDD by the P-type MOS transistor constituting the second reset unit 2. In other words, assuming that a breakdown voltage of the APD 1 is represented by Vbr, a PN junction reverse bias voltage between the cathode and the anode is represented by Vbr+Vex, where Vex represents the amount of voltage that exceeds the breakdown voltage. If the MOS transistor constituting the switch 6 is in the on state and the MOS transistor constituting the reset unit 8 is in the off state, a typical single photon avalanche diode (SPAD) operation is carried out.

When a photon is incident on the APD 1, generated signal carriers trigger an avalanche current, and the cathode potential Vc decreases to a potential that is less than or equal to a predetermined potential, i.e., a threshold voltage of the detection unit 4. This voltage drop stops when the reverse bias in the PN junction of the APD 1 reaches the breakdown voltage Vbr. As a result, the avalanche current is also stopped and then the cathode potential Vc is increased to the voltage VDD by the second reset unit 2. During this process, the cathode potential Vc reaches the threshold voltage of the detection unit 4 again. That is, when a single photon is incident, the cathode potential Vc changes from a potential higher than the threshold voltage of the detection unit 4 to a voltage lower than the threshold voltage, and further changes from the potential lower than the threshold voltage of the detection unit 4 to a potential higher than the threshold voltage.

The voltage VDD, the Vex, and the threshold voltage are set such that the threshold voltage of the detection unit 4 is set to a value between the VDD and (VDD−Vex). Accordingly, the detection unit 4 basically detects one generation time of an avalanche current which is triggered by incident of a single photon, and generates one output pulse. This output pulse is counted by the counter 5. As a result, the counter 5 counts the number of photons which are incident on the APD 1.

Figure 3:
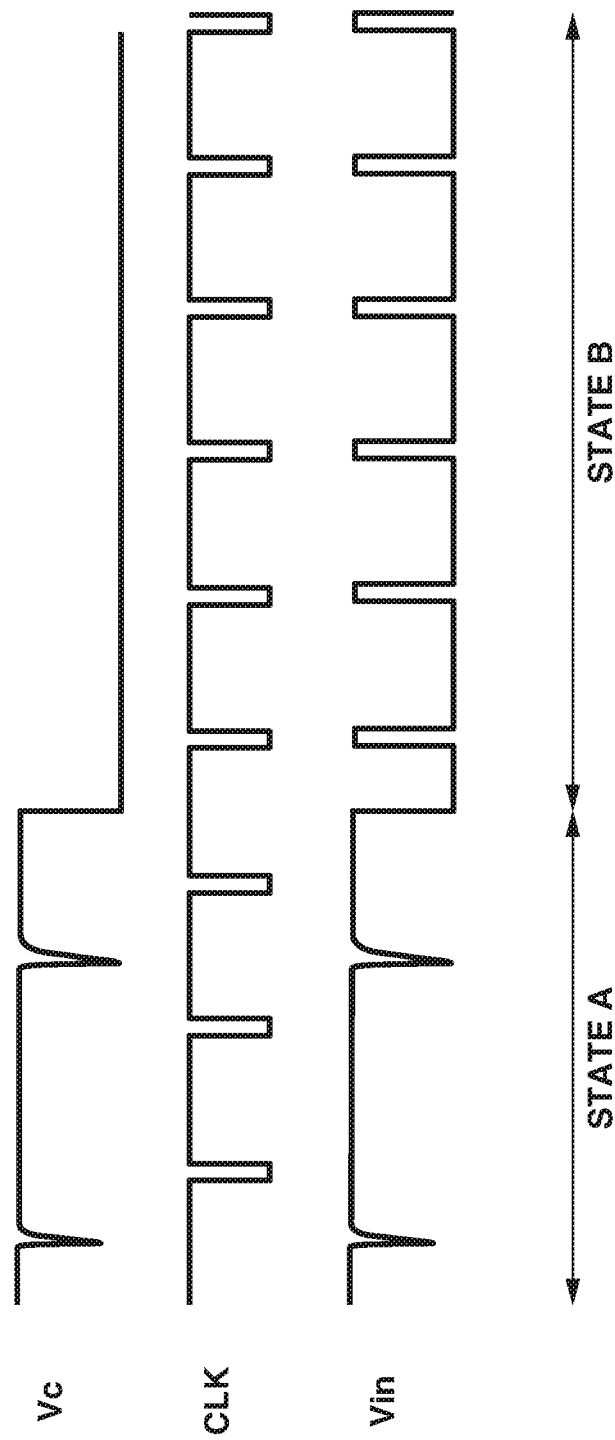
FIG. 3 is a timing diagram illustrating an operation according to the first exemplary embodiment.

FIG. 3 is a timing diagram illustrating on/off states of each of the potential Vc of the cathode of the APD 1 illustrated in FIG. 2, a control pulse (clock pulse) CLK based on which the operation of the photoelectric conversion unit is performed, and an input potential Vin of the detection unit 4. The control pulse CLK is input to each of the control line 7 and the control line 9. In the timing diagram illustrated in FIG. 3, a state A indicates a state where a pileup state does not occur, i.e., a state where photons are not continuously incident on the APD 1 and incident photons are normally counted one by one, and a state B indicates a pileup state, i.e., a state where photons are continuously incident on the APD 1 without no interruption.

The control pulse CLK is normally set to a high level (Hi). The MOS transistor constituting the switch 6 is normally in the on state, and the MOS transistor constituting the reset unit 8 is normally in the off state. When the control pulse CLK is set to a low level (Lo), the MOS transistor constituting the switch 6 is turned off and the MOS transistor constituting the reset unit 8 is turned on, so that the input potential Vin is reset to the voltage VDD, i.e., the high level (Hi). If the control pulse CLK is constantly at the high level (Hi), when the pileup state occurs, a current continuously flows to the APD 1. Accordingly, the input potential Vin is kept at the low level (Lo) and does not change, and thus no count pulse is generated. On the other hand, in the present exemplary embodiment, every time the control pulse CLK is changed from the high level (Hi) to the low level (Lo), the input potential Vin changes from the low level (Lo) to the high level (Hi). Thus, a count pulse can be generated every time the input potential Vin is changed from the low level (Lo) to the high level (Hi), so that the counter 5 can count the number of count pulses.

When the cathode potential Vc is set to the voltage VDD, the reverse bias voltage between the cathode and the anode is given by about Vex/Ron as the value of the current that continuously flows to the APD 1 in the pileup state. This is because the cathode potential Vc is about a potential at which the reverse bias voltage between the cathode and the anode reaches the breakdown voltage Vbr and the difference between the voltage VDD and the cathode potential Vc corresponds to the Vex. Thus, in the pileup state, the amount Vex/Ron of current continuously flows on average, while the avalanche current flows or stops.

However, the avalanche current generates as soon as the cathode potential Vc is forcibly increased in the pileup state. Accordingly, it is difficult, for a configuration in which the switch 6 is absent and only the P-type MOS transistor constituting the reset unit 8 is provided, to reset the input potential Vin, i.e., the potential Vc, to the voltage VDD against the avalanche current. Further, since the second reset unit 2 and the reset unit 8 operate in parallel and the resistance between the cathode potential Vc and the power supply voltage VDD decreases, a larger avalanche current is induced. This leads to a further increase in wasteful power consumption.

According to the present exemplary embodiment, the input potential Vin of the detection unit 4 can be reset to the power supply voltage VDD during a period in which the N-type MOS transistor constituting the switch 6 is in the off state, i.e., the cathode potential Vc of the APD 1 and the input potential Vin of the detection unit 4 are electrically disconnected.

In the first exemplary embodiment, the control pulse CLK is periodically input to the photoelectric conversion unit as illustrated in FIG. 3 during an exposure period. With this configuration, as described above, the counting of control pulses is advanced in the pileup state, thus making it possible to prevent or reduce the nonlinearity of photoelectric conversion characteristics and the occurrence of darkening when light with a high illuminance is incident. In addition, this advantageous effect depends on the frequency of the control pulse CLK, and the counting is advanced as the frequency increases. Thus, this advantageous effect is enhanced as the frequency increases. Assuming that, when a single photon is incident, an interval between a falling edge and a rising edge of the cathode potential Vc when the threshold voltage of the detection unit 4 is passed through is represented by a dead time Td, a substantially maximum effect is obtained at a frequency of 1/Td. If the frequency is higher than 1/Td, there is a possibility that photons more than the actual number of incident photons may be counted.

In the example illustrated in FIGS. 2 and 3, the control pulse CLK is simultaneously input to the switch 6 and the reset unit 8. The transistor constituting the switch 6 and the transistor constituting the reset unit 8 have opposite conductivity types, so that the both transistors can be operated by a single control pulse CLK. However, different control pulses may be input to the switch 6 and the reset unit 8. If a period in which the switch 6 is in the on state and a period in which the reset unit 8 is in the on state temporally overlap each other, a large avalanche current flows in the photoelectric conversion unit in which the pileup occurs at the moment. To reliably prevent this phenomenon, a period in which the switch 6 is in the off state may desirably include a period in which the reset unit 8 is in the on state. Accordingly, for example, the supply of the control pulse CLK to the switch 6 is turned off, and then the supply of the control pulse CLK to the reset unit 8 is turned off. Further, after the supply of the control pulse CLK to the reset unit 8 is turned on, the supply of the control pulse CLK to the switch 6 is turned on.

As described above, according to the first exemplary embodiment, the counting is advanced even when light that causes the pileup state is incident, thus making it possible to control the degree of the nonlinearity of photoelectric conversion characteristics and reduce or prevent degradation in output when light with a high illuminance is incident.

Figure 4:
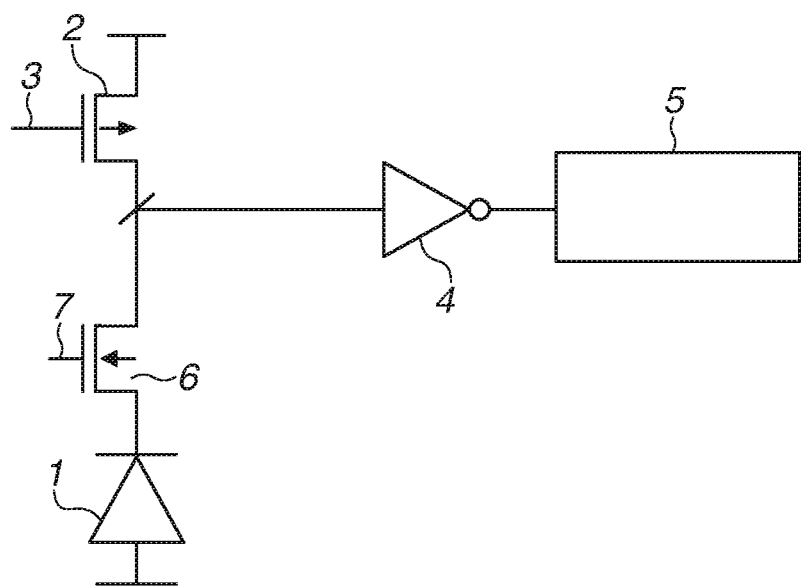
FIG. 4 is an equivalent circuit diagram illustrating a photoelectric conversion unit according to a second exemplary embodiment.

A second exemplary embodiment of the present disclosure will be described below. FIG. 4 is an equivalent circuit diagram illustrating a photoelectric conversion unit according to the present exemplary embodiment. The second exemplary embodiment differs from the first exemplary embodiment in that the second reset unit 2 functions to reset the input node of the detection unit 4 and also functions to reset the cathode potential Vc of the APD 1. Only differences between the second exemplary embodiment and the first exemplary embodiment will be described below, and descriptions of the other components of the second exemplary embodiment that are similar to those of the first exemplary embodiment will be omitted.

The control pulse CLK illustrated in FIG. 3 is supplied to the gate of the N-type MOS transistor constituting the switch 6 through the control line 7. In the pileup state, the second reset unit 2 functions as a resistor that increases the potential Vin of an input of the detection unit 4 to the voltage VDD during a period in which the control pulse CLK is at the low level (Lo). A time required for increasing the potential Vin is substantially equal to the dead time Td. Accordingly, in the second exemplary embodiment, a time interval in which the control pulse CLK is set to the low level may be desirably greater than or equal to the dead time Td.

In the second exemplary embodiment, the frequency of the control pulse CLK cannot be increased by the amount corresponding to that in the first exemplary embodiment. However, according to the second exemplary embodiment, it is possible to improve or prevent the nonlinearity of photoelectric conversion characteristics caused due to the pileup state, and it is also possible to prevent a malfunction, such as darkening, when light with a high illuminance is incident.

In the second exemplary embodiment, the number of transistors is reduced compared to that in the first exemplary embodiment. Accordingly, the configuration according to the present exemplary embodiment is less likely to be limited by an upper limit of transistors to be integrated than in the first exemplary embodiment. Furthermore, the number of gate electrodes to which the control pulse CLK is connected in the second exemplary embodiment is one half the number of gate electrodes connected to the control pulse CLK in the first exemplary embodiment. This contributes to a reduction of power required for driving the control pulse CLK to about one half the power in the first exemplary embodiment.

Figure 5:
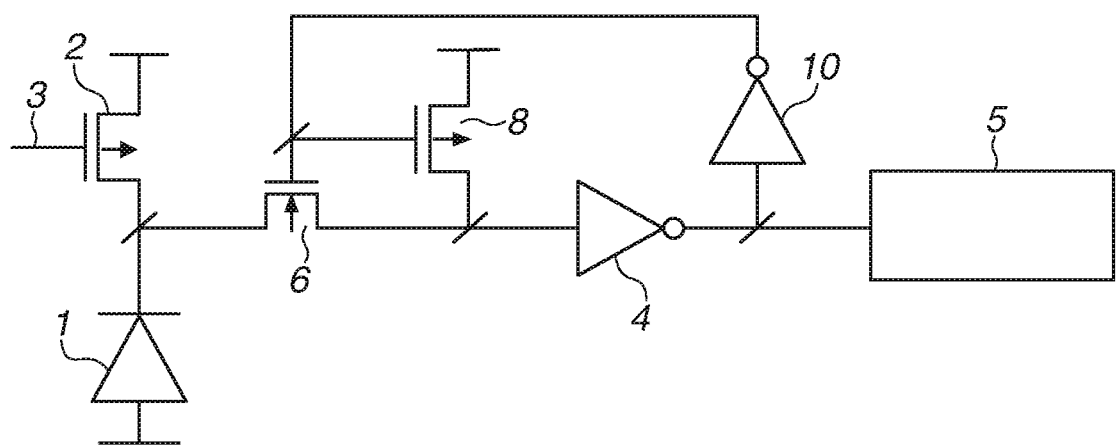
FIG. 5 is an equivalent circuit diagram illustrating a photoelectric conversion unit according to a third exemplary embodiment.

A third exemplary embodiment of the present disclosure will be described below. FIG. 5 is an equivalent circuit diagram illustrating a photoelectric conversion unit according to the present exemplary embodiment. The third exemplary embodiment differs from the first exemplary embodiment in that the switch 6 and the reset unit 8 are not controlled based on the control pulse CLK, but are controlled based on an output value from the detection unit 4. Only differences between the third exemplary embodiment and the first exemplary embodiment will be described below, and descriptions of the other components of the third exemplary embodiment that are similar to those of the first exemplary embodiment will be omitted.

As illustrated in FIG. 5, an input node of an inverter 10 (second inverter) is connected to each of the output node of the detection unit 4 and the input node of the counter 5. Assuming that a response time of the inverter 10 is represented by Trsp, the response time Trsp is set to a value that is substantially greater than or equal to the dead time Td. As illustrated in FIG. 5, the inverter 10 receives an output from the detection unit 4 and controls turning on and off of each of the switch 6 and the reset unit 8.

Figure 6:
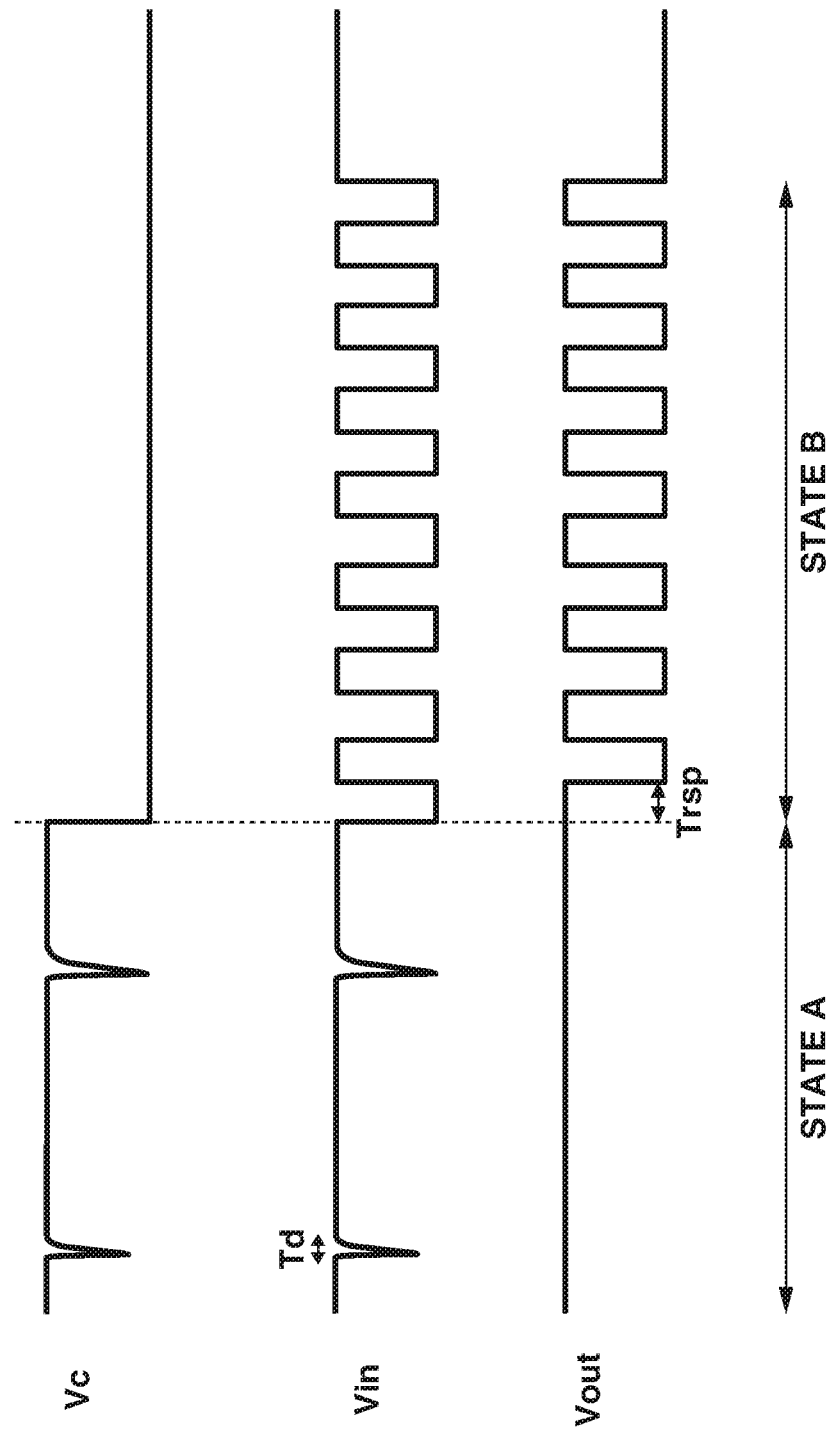
FIG. 6 is a timing diagram illustrating an operation according to the third exemplary embodiment.

FIG. 6 is a timing diagram illustrating an operation of the photoelectric conversion unit illustrated in FIG. 5. FIG. 6 illustrates the potential Vc of the cathode, the input potential Vin of the detection unit 4, and an output potential Vout of the inverter 10. Accordingly, the potential Vout corresponds to the gate potential of each of the switch 6 and the reset unit 8. In the timing diagram illustrated in FIG. 6, the response time Trsp is longer than the dead time Td.

In a case where a photon is incident in the state where incident photons can be normally counted (state A) and a count pulse is output from the detection unit 4, the width of the count pulse is substantially equal to the dead time Td, while Td<Trsp holds. Thus, basically, the inverter 10 does not respond to the count pulse.

Next, when the potential Vin is set to the low level (Lo) in the pileup state (state B), the potential Vout becomes the low level (Lo) with a delay corresponding to the response time Trsp. The switch 6 is then turned off and the reset unit 8 is turned on, and thus, as described above in the first exemplary embodiment, the switch 6 is not electrically continuous and the potential Vin reaches the voltage VDD (Hi). Accordingly, the potential Vout is also set to the high level (Hi) with a delay corresponding to the response time Trsp. The switch 6 is then turned on and the reset unit 8 is turned off, so that the input potential Vin is set to the low level (Lo) in the pileup state.

As long as the pileup state lasts, this cycle is repeated and a count pulse with a cycle of 2×Trsp is generated, so that the counting is advanced in the pileup state.

As understood from the above description, also in the third exemplary embodiment, as in the first and second exemplary embodiments, it is possible to improve the nonlinearity of photoelectric conversion characteristics caused due to the pileup state, and it is also possible to reduce or prevent darkening when light with a high illuminance is incident.

In the first and second exemplary embodiments, the control pulse CLK is basically supplied to all photoelectric conversion units. In other words, the control pulse CLK is also supplied to the photoelectric conversion units in which the pileup does not occur among the plurality of photoelectric conversion units included in the photoelectric conversion apparatus. Therefore, according to the third exemplary embodiment, it is possible to reset the potential Vin for each photoelectric conversion unit. Specifically, the above-described count clock cycle is activated only during the pileup state period of the photoelectric conversion unit in which the pileup occurs. Thus, unnecessary electric energy can be reduced. In other words, electric energy consumption in the above-described circuit used as a countermeasure against the pileup is basically zero when the no pileup occurs.

In the first and second exemplary embodiments, if a photon is incident in a normal state during a period in which the control pulse CLK is at the low level (Lo), a counting loss occurs. This is because the switch 6 is in the off state during the period in which the control pulse CLK is at the low level (Lo), and thus the APD 1 and the detection unit 4 are electrically disconnected. According to the third exemplary embodiment, such a counting loss does not occur.

For the reasons described above, according to the third exemplary embodiment, it is possible to eliminate wasteful energy consumption and obtain the effect of preventing the pileup from occurring without causing a counting loss.

Figure 7:
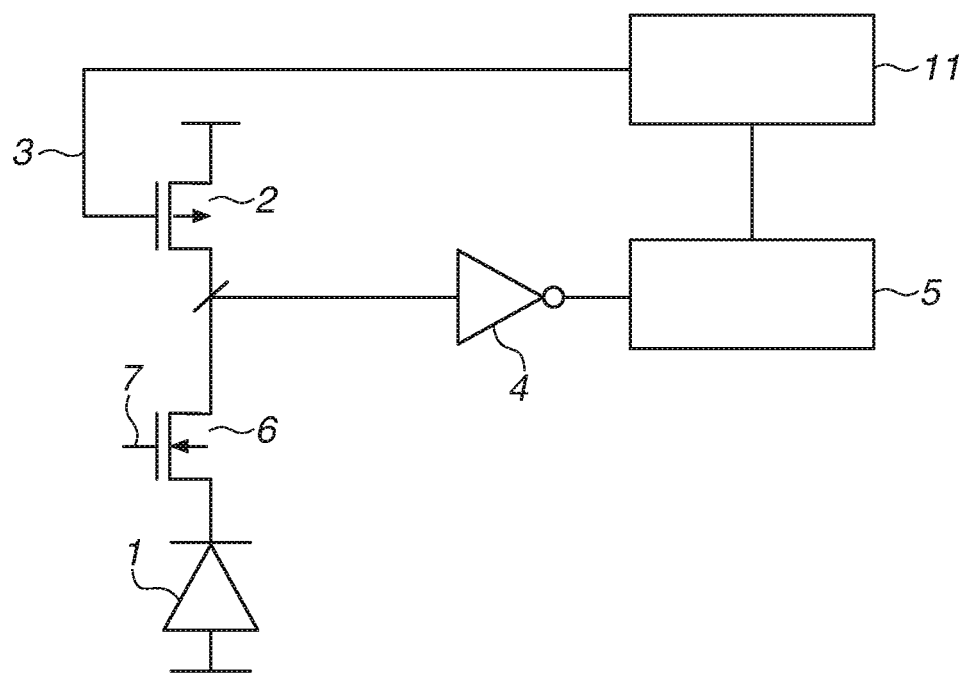
FIG. 7 is an equivalent circuit diagram illustrating a photoelectric conversion unit according to a fourth exemplary embodiment.

A fourth exemplary embodiment of the present disclosure will be described below. FIG. 7 is an equivalent circuit diagram illustrating a photoelectric conversion unit according to the present exemplary embodiment. The photoelectric conversion unit according to the fourth exemplary embodiment differs from the photoelectric conversion unit according to the second exemplary embodiment in that a potential to be input to the second reset unit 2 is changed when the count number of the counter 5 reaches a predetermined value. Only differences between the fourth exemplary embodiment and the second exemplary embodiment will be described below, and descriptions the other components of the fourth exemplary embodiment that are similar to those of the second exemplary embodiment will be omitted.

In the example illustrated in FIG. 7, the counter 5 is connected to a control circuit 11. The control circuit 11 is a circuit that turns off the second reset unit 2 when the count number reaches the predetermined value. With this configuration, when the count number reaches the predetermined value, avalanche multiplication in the APD 1 is stopped. This operation will be described in detail below.

The switch 6 is supplied with the control pulse CLK described above in the second exemplary embodiment. A period in which the supply of the control pulse CLK is turned off, the switch 6 is in the off state. In a case where the second reset unit 2 is turned off, for example, when the predetermined value corresponds to a saturation value of the counter 5, i.e., when the count value of the counter 5 reaches a most significant bit, the control circuit 11 is connected to a most significant bit output of the counter 5. When the counting is advanced to the most significant bit and the most significant bit output is set to the high level (Hi), the control circuit 11 supplies the control line 3 with the potential VDD. When the most significant bit is set to the low level (Lo), the control circuit 11 supplies the control line 3 with a potential at which the P-type MOS transistor constituting the second reset unit 2 has the desired ON resistance Ron.

According to the fourth exemplary embodiment, power consumption in the photoelectric conversion units in which the pileup state occurs can be considerably reduced compared with Japanese Patent Application Laid-Open No. 2019-009768. In other words, according to the configuration discussed in Japanese Patent Application Laid-Open No. 2019-009768, the counting is not advanced in the photoelectric conversion units in which the pileup occurs, so that the count value does not reach the predetermined count value for stopping the operation of the APD 1 and a wasteful current continuously flows. On the other hand, according to the fourth exemplary embodiment, the counting is advanced even in the pileup state, and thus the count value reaches the predetermined count value and the current flowing to the APD 1 in the photoelectric conversion units in which the pileup occurs can be stopped.

Therefore, according to the fourth exemplary embodiment, it is possible to reduce or prevent wasteful power consumption in the photoelectric conversion units in which the pileup occurs and reduce or prevents power consumption when the counting is saturated. This leads to a further reduction in power consumption. It is also possible to improve the nonlinearity of photoelectric conversion characteristics caused due to the pileup and reduce or prevent degradation in output when light with a high illuminance is incident.

In the fourth exemplary embodiment, the second exemplary embodiment is used to address the pileup, but instead the first or third exemplary embodiment may be used in combination with the control circuit 11.

Figure 8:
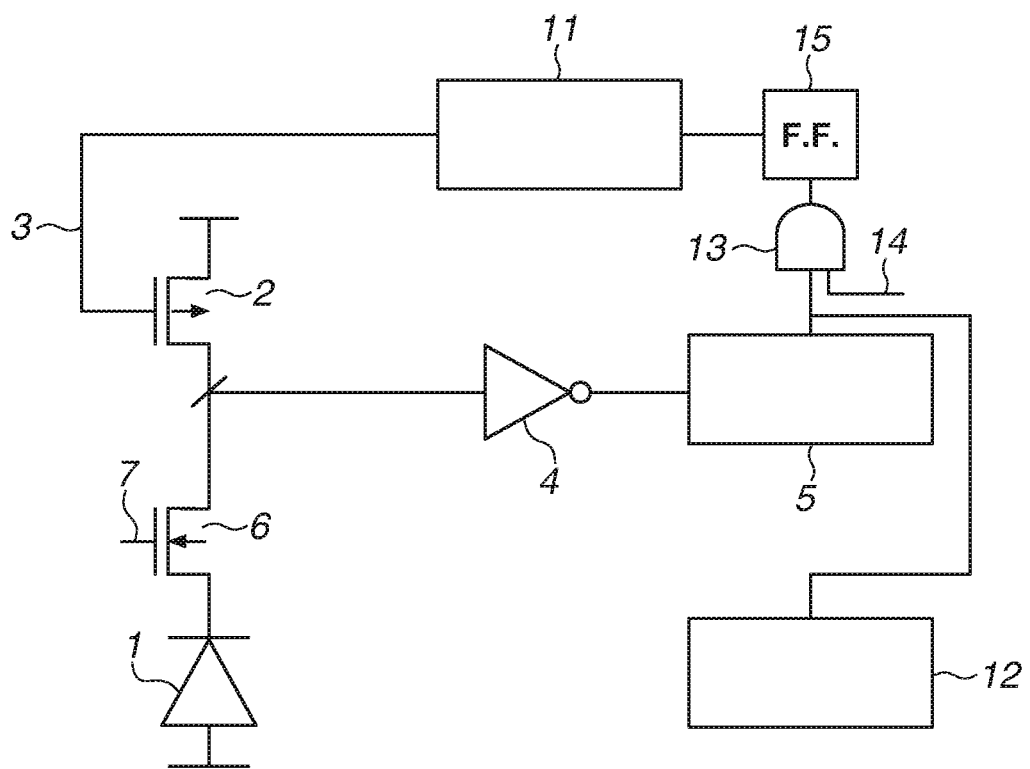
FIG. 8 is an equivalent circuit diagram illustrating a photoelectric conversion unit according to a fifth exemplary embodiment.

A fifth exemplary embodiment of the present disclosure will be described below. FIG. 8 is an equivalent circuit diagram illustrating a photoelectric conversion unit according to the present exemplary embodiment. In the photoelectric conversion unit according to the present exemplary embodiment, time information indicating a time when the count number of the counter 5 reaches a predetermined value is written into a memory 12. The switch 6 is turned on only once during an exposure time. Only differences between the fifth exemplary embodiment and the fourth exemplary embodiment will be described below, and descriptions of the other components of the fifth exemplary embodiment that are similar to those of the fourth exemplary embodiment will be omitted.

As illustrated in FIG. 8, each photoelectric conversion unit includes the memory 12 that stores an exposure time for the photoelectric conversion unit. Each photoelectric conversion unit includes an AND gate 13, a control line 14 that is connected to one of input terminals of the AND gate 13, and a flip-flop 15 that receives a signal from the AND gate 13.

Figure 9:
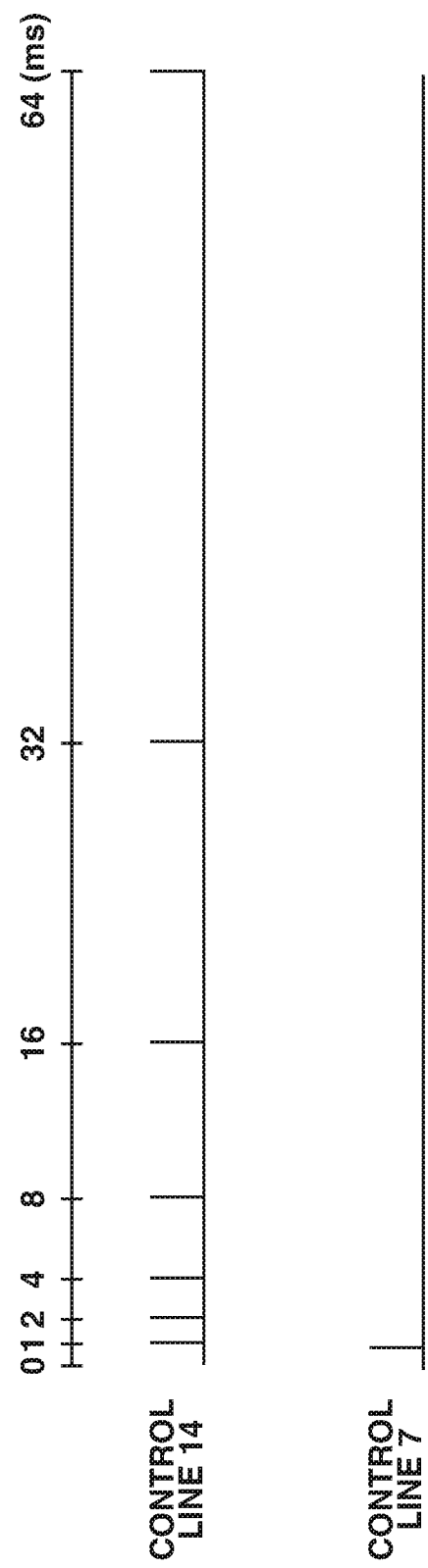
FIG. 9 is a timing diagram illustrating an operation according to the fifth exemplary embodiment.

FIG. 9 is a timing diagram illustrating an operation of the photoelectric conversion unit illustrated in FIG. 8. For ease of explanation, assuming that t0=1 ms, a predetermined exposure time represented by t0×(2 to the (T−1)th power) is set. The control line 14 is supplied with a pulse that is set to the high level (Hi) only at the time when the exposure time determined based on T=1, 2, 3, . . . Tmax is reached. Assume herein that Tmax=7, i.e., a longest exposure time is 64 ms. Accordingly, in this case, if the count value of the counter 5 reaches the predetermined value at seven time points described above, the flip-flop 15 is set to the high level (Hi). Thus, after that, an avalanche operation of the APD 1 is stopped. Once the operation of the APD 1 is stopped, no count pulse is output and the count number of the counter 5 is maintained at the current value. Then, a value T indicating the exposure time when the flip-flow 15 is set to the high level (Hi) is written into the memory 12.

As in the configuration discussed in Japanese Patent Application Laid-Open No. 2019-009768, also in the present exemplary embodiment, information indicating a signal from each photoelectric conversion unit may be calculated based on the information about the exposure time stored in the memory 12 and the count value. Thus, a sufficient saturation signal can be maintained while an increase in power consumption due to a continuous operation of the APD 1 can be reduced or prevented.

The control pulse CLK may be added to the control line 7 until the value T reaches "1" (T=1), i.e., the control pulse CLK may be added for only the first 1 ms with respect to the exposure time of 64 ms. This is because, in the photoelectric conversion unit that receives light with a high illuminance which causes the pileup, the count number reaches the predetermined count value at the first 1 ms. In other words, the photoelectric conversion unit that receives light with a high illuminance is to be screened at the first 1 ms, and thus, it is considered that the count value does not reach the predetermined count value at 1 ms for the photoelectric conversion unit that receives a less amount of light with a high illuminance and in which the pileup state does not occur. Accordingly, in the fifth exemplary embodiment, the control signal CLK used to address the pileup is operated only during the first one exposure unit time, which attains an object of the present disclosure.

According to the present exemplary embodiment, it is possible to considerably reduce power consumption for supplying the control pulse CLK and minimize a counting loss in normal photon incident in the period in which the control pulse CLK is at the low level (Lo). These two advantageous effects and the effect of reducing wasteful power consumption in the photoelectric conversion units in the pileup state are produced.

Thus, in the fifth exemplary embodiment, the counter 5 that has reached the predetermined value is stopped to thereby reduce wasteful power consumption and maintain the saturation state while reducing the entire number of counts. In addition, power consumption in the photoelectric conversion units in which the pileup occurs can be reduced. Accordingly, it is possible to obtain the effect of further reducing power consumption, and it is also possible to improve the nonlinearity of photoelectric conversion characteristics caused due to the pileup state and prevent a malfunction, i.e., a degradation in output when light with a high illuminance is incident. Moreover, a power consumption associated with a driving operation for addressing the pileup can be considerably reduced and a counting loss of incident photons can be reduced to a negligible level.

Figure 10:
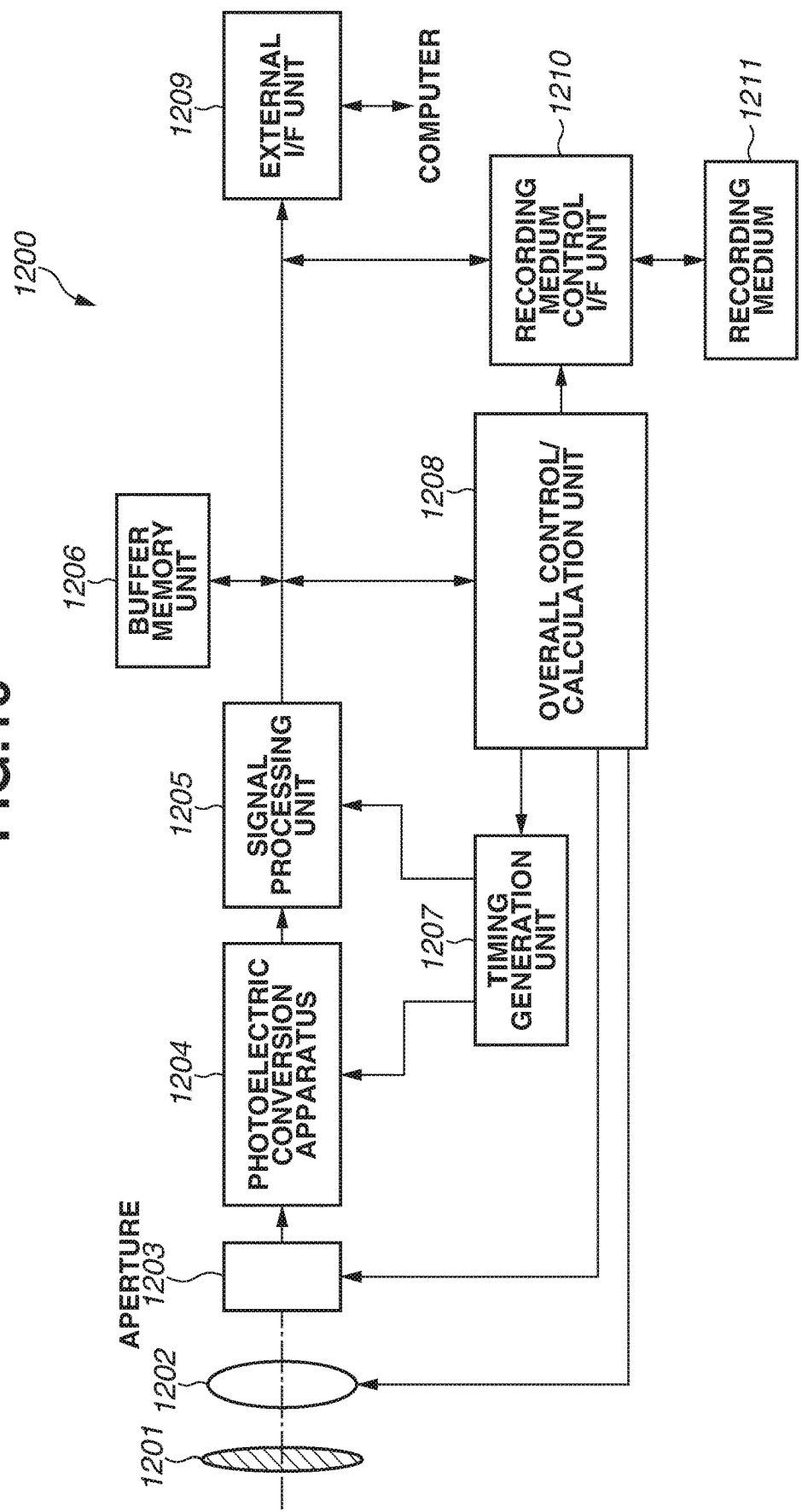
FIG. 10 is a block diagram illustrating a photoelectric conversion system according to a sixth exemplary embodiment.

A sixth exemplary embodiment of the present disclosure will be described below. FIG. 10 is a block diagram illustrating a configuration of a photoelectric conversion system 1200 according to the present exemplary embodiment. The photoelectric conversion system 1200 according to the sixth exemplary embodiment includes a photoelectric conversion apparatus 1204. Here, any one of the photoelectric conversion apparatuses described above can be applied to the photoelectric conversion apparatus 1204. The photoelectric conversion system 1200 can be used as, for example, an image capturing system. Specific examples of the image capturing system include a digital still camera, a digital camcorder, and a monitoring camera. FIG. 10 illustrates an example where a digital still camera is used as the photoelectric conversion system 1200.

The photoelectric conversion system 1200 illustrated in FIG. 10 includes the photoelectric conversion apparatus 1204, a lens 1202 for forming an optical image of a subject on the photoelectric conversion apparatus 1204, an aperture 1203 for making the quantity of light passing through the lens 1202 variable, and a barrier 1201 for protecting the lens 1202. The lens 1202 and the aperture 1203 is an optical system that focuses light on the photoelectric conversion apparatus 1204.

The photoelectric conversion system 1200 also includes a signal processing unit 1205 that performs processing on an output signal output from the photoelectric conversion apparatus 1204. The signal processing unit 1205 performs a signal processing operation for performing various correction and compression processes on the input signal, as needed, and outputting the processed signal. The photoelectric conversion system 1200 further includes a buffer memory unit 1206 for temporarily storing image data, and an external interface (I/F) unit 1209 for communicating with an external computer and the like. The photoelectric conversion system 1200 further includes a recording medium 1211, such as a semiconductor memory, for recording or reading captured data, and a recording medium control I/F unit 1210 for recording data onto the recording medium 1211 or reading out data from the recording medium 1211. The recording medium 1211 may be incorporated in the photoelectric conversion system 1200, or may be detachably attached to the photoelectric conversion system 1200. Communication from the recording medium control I/F unit 1210 to the recording medium 1211 may be established by wireless communication, and communication from the external I/F unit 1209 may also be established by wireless communication.

The photoelectric conversion system 1200 further includes an overall/control calculation unit 1208 that performs various calculations and controls the overall operation of the digital still camera, and a timing generation unit 1207 that outputs various timing signals to the photoelectric conversion apparatus 1204 and the signal processing unit 1205. In this case, timing signals and the like may be input from the outside of the photoelectric conversion system 1200, and the photoelectric conversion system 1200 may include at least the photoelectric conversion apparatus 1204 and the signal processing unit 1205 that processes the output signal output from the photoelectric conversion apparatus 1204. As described above in the fourth exemplary embodiment, the timing generation unit 1207 may be mounted on the photoelectric conversion apparatus. The overall control/calculation unit 1208 and the timing generation unit 1207 may be configured to implement some or all control functions of the photoelectric conversion apparatus 1204.

The photoelectric conversion apparatus 1204 outputs an image signal to the signal processing unit 1205. The signal processing unit 1205 performs predetermined signal processing on the image signal output from the photoelectric conversion apparatus 1204, and outputs image data. The signal processing unit 1205 generates an image by using the image signal. The signal processing unit 1205 and the timing generation unit 1207 may be mounted on a photoelectric conversion apparatus. Specifically, the signal processing unit 1205 and the timing generation unit 1207 may be provided on a substrate on which pixels are disposed, or may be provided on different substrates, as described above in the third exemplary embodiment. An image capturing system capable of acquiring an image with an excellent quality can be achieved by configuring the image capturing system using any one of the photoelectric conversion apparatuses according to the exemplary embodiments described above.

Figure 11A:
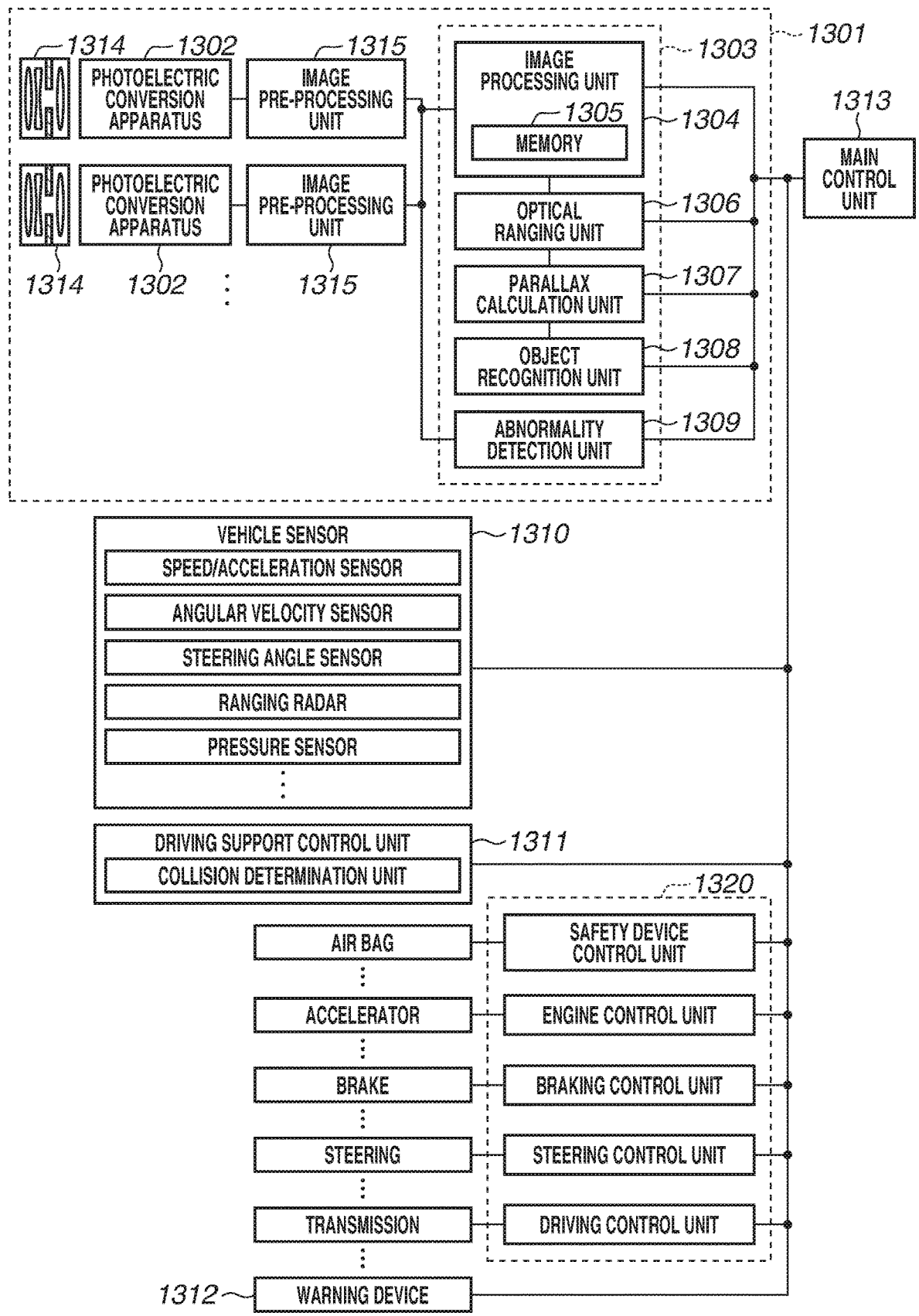
Figure 12:
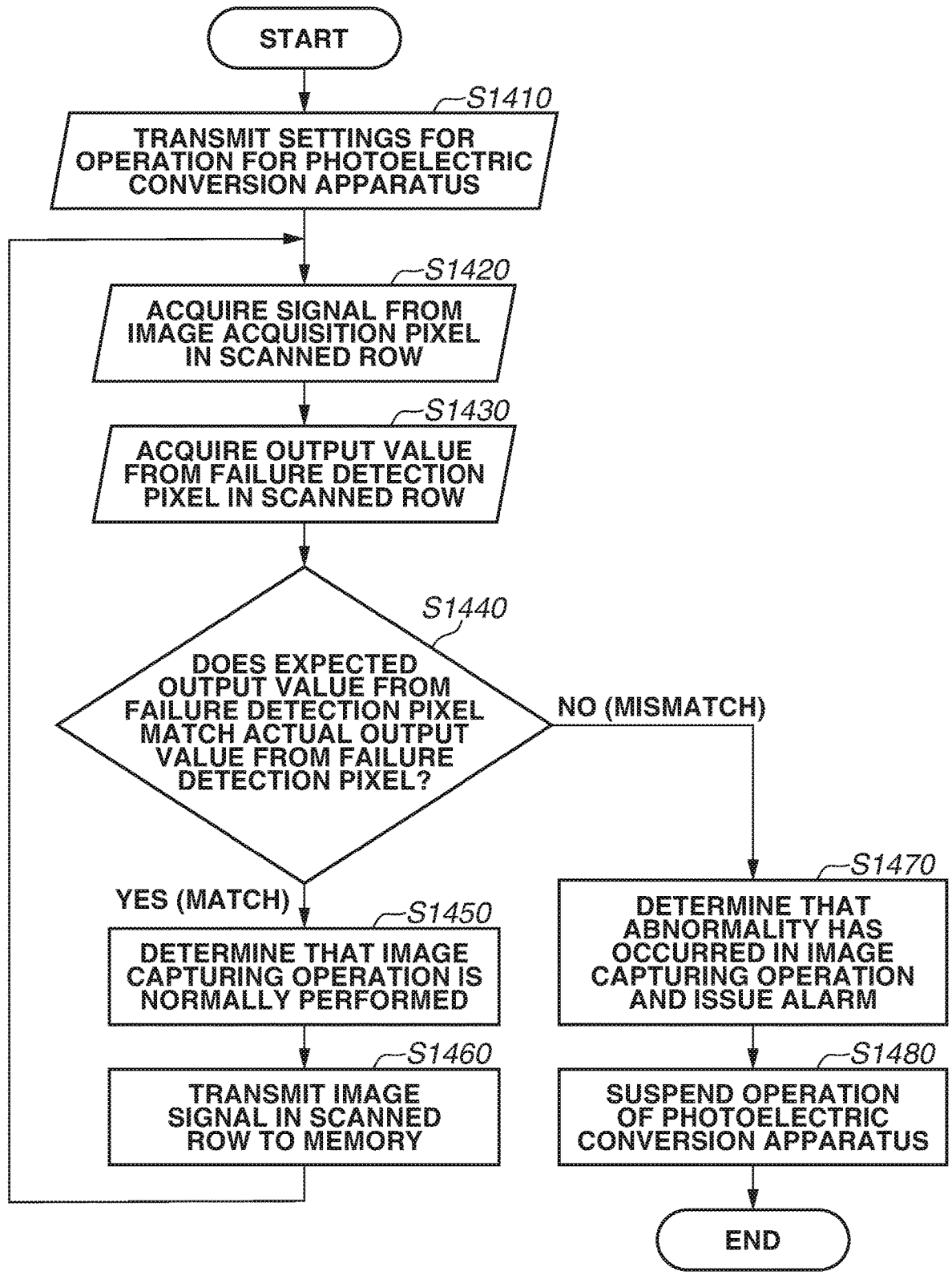
FIG. 12 is a flowchart illustrating an operation which is performed by the photoelectric conversion system according to the seventh exemplary embodiment.

A seventh exemplary embodiment of the present disclosure will be described below. A photoelectric conversion system and a moving body according to the present exemplary embodiment will be described with reference to FIGS. 11A and 11B and FIG. 12. FIGS. 11A and 11B are schematic diagrams each illustrating the photoelectric conversion system and the moving body according to the seventh exemplary embodiment. FIG. 12 is a flowchart illustrating an operation which is performed by the photoelectric conversion system according to the seventh exemplary embodiment. The present exemplary embodiment illustrates an example where an on-vehicle camera is used as the photoelectric conversion system.

FIG. 11A illustrates an example of a vehicle system and an example of the photoelectric conversion system that performs an image capturing operation. A photoelectric conversion system 1301 includes photoelectric conversion apparatuses 1302, image pre-processing units 1315, an integrated circuit 1303, and optical systems 1314. Each optical system 1314 forms an optical image of a subject on the corresponding photoelectric conversion apparatus 1302. Each photoelectric conversion apparatus 1302 converts the optical image of the subject formed by the corresponding optical system 1314 into an electrical signal. Each photoelectric conversion apparatus 1302 is any one of the photoelectric conversion apparatuses according to the exemplary embodiments described above. Each image pre-processing unit 1315 performs predetermined signal processing on a signal output from the corresponding photoelectric conversion apparatus 1302. The function of each image pre-processing unit 1315 may be incorporated in the corresponding photoelectric conversion apparatus 1302. The photoelectric conversion system 1301 is provided with at least two sets of the optical system 1314, the photoelectric conversion apparatus 1302, and the image pre-processing unit 1315, and an output from the image pre-processing unit 1315 in each set is input to the integrated circuit 1303.

The integrated circuit 1303 is an integrated circuit used for an image capturing system, and includes an image processing unit 1304 including a memory 1305, an optical ranging unit 1306, a parallax calculation unit 1307, an object recognition unit 1308, and an abnormality detection unit 1309. The image processing unit 1304 performs image processing, such as development processing or defect correction processing, on an output signal from each image pre-processing unit 1315. The memory 1305 temporarily stores a captured image and stores a defect position in a pixel of a captured image. The optical ranging unit 1306 performs subject focusing processing and ranging processing. The parallax calculation unit 1307 calculates parallax information (phase difference between parallax images) based on a plurality of pieces of image data acquired by the plurality of photoelectric conversion apparatuses 1302. The object recognition unit 1308 recognizes a subject, such as a vehicle, a road, an indicator, and a person. Upon detecting an abnormality in any one of the photoelectric conversion apparatuses 1302, the abnormality detection unit 1309 issues an alarm to a main control unit 1313.

The integrated circuit 1303 may be implemented by an exclusively designed hardware device, a software module, or a combination thereof. Further, the integrated circuit 1303 may be implemented by a field programmable gate array (FPGA), an application specific integrated circuit (ASIC), or the like, or may be implemented by a combination thereof. Part or all of the integrated circuit 1303 may be implemented by a programmable processor or device, or a central processing unit (CPU), that executes instructions or programs stored in a memory to perform operations as described in the following.

The main control unit 1313 controls the overall operation of each of the photoelectric conversion system 1301, a vehicle sensor 1310, a control unit 1320, and the like. It is also possible to employ a method (e.g., controller area network (CAN) standards) in which the main control unit 1313 is omitted and each of the photoelectric conversion system 1301, the vehicle sensor 1310, and the control unit 1320 includes an individual communication interface to transmit or receive a control signal via a communication network. The main control unit 1313 may be implemented fully or partially as a programmable device or processor, such as a central processing unit (CPU), that executes instructions or programs stored in memories to perform operations describe in the following.

The integrated circuit 1303 includes the function of receiving a control signal from the main control unit 1313 or transmitting a control signal or a setting value to each photoelectric conversion apparatus 1302 by using a control unit in the integrated circuit 1303.

The photoelectric conversion system 1301 is connected to the vehicle sensor 1310, and can detect a traveling state, including a vehicle speed, a yaw rate, and a steering angle, of a vehicle for which the photoelectric conversion system 1301 is used, an environment outside the vehicle, and states of other vehicles and obstacles. The vehicle sensor 1310 also serves as a distance information acquisition unit that acquires distance information indicating a distance to an object from parallax images. The photoelectric conversion system 1301 is also connected to a driving support control unit 1311 that performs various driving support operations, such as automatic steering, automatic cruising, and a collision prevention function. In particular, for the collision determination function, the photoelectric conversion system 1301 estimates and determines the presence or absence of a collision with another vehicle or an obstacle based on detection results of the photoelectric conversion system 1301 and the vehicle sensor 1310. If a collision is estimated, avoidance control and collision safety devices are activated.

The photoelectric conversion system 1301 is also connected to a warning device 1312 for issuing an alarm to a driver based on a determination result of a collision determination unit. For example, if the determination result of the collision determination unit shows a high possibility of a collision, the main control unit 1313 performs vehicle control for avoiding the collision or reducing damage by putting on a brake, releasing an accelerator, or reducing an engine output. The warning device 1312 warns a user by issuing an alarm, such as sound, displaying alarm information on a display unit screen of a car navigation system or a meter panel, or vibrating a seatbelt or a steering wheel.

In the present exemplary embodiment, the photoelectric conversion system 1301 captures an image in the vicinity of the vehicle, e.g., in front or behind the vehicle. FIG. 11B illustrates an arrangement example of the photoelectric conversion system 1301 in a case where the photoelectric conversion system 1301 captures an image in front of the vehicle.

The two photoelectric conversion apparatuses 1302 are disposed in front of a vehicle 1300. Specifically, in terms of acquisition of the distance information or determination of the possibility of a collision between the vehicle 1300 and an object to be captured, it is desirable that a center line with respect to a traveling direction or an external shape (e.g., a vehicle width) of the vehicle 1300 be defined as a symmetry axis and arrange the two photoelectric conversion apparatuses 1302 in line symmetry with respect to the symmetry axis. Further, it is desirable that the photoelectric conversion apparatuses 1302 be arranged so as not to block the driver's field of view when the driver views the status outside the vehicle 1300 from a driver's seat. It is desirable that the warning device 1312 be arranged so as to be easily viewed by the driver.

Next, a failure detection operation which is performed by each photoelectric conversion apparatus 1302 in the photoelectric conversion system 1301 will be described with reference to FIG. 12. The failure detection operation which is performed by each photoelectric conversion apparatus 1302 is carried out according to steps S1410 to S1480 illustrated in FIG. 12.

In step S1410, settings are made for start-up of each photoelectric conversion apparatus 1302. Specifically, settings for operating the photoelectric conversion apparatus 1302 are transmitted from the outside (e.g., the main control unit 1313) of the photoelectric conversion system 1301, or from the inside of the photoelectric conversion system 1301, and the image capturing operation and failure detection operation of the photoelectric conversion apparatus 1302 are started.

Next, in step S1420, a pixel signal is acquired from an effective pixel. In step S1430, an output value is acquired from a failure detection pixel provided for failure detection. This failure detection pixel includes a photoelectric conversion unit, as in an effective pixel. A predetermined voltage is written into the photoelectric conversion unit. The failure detection pixel outputs a signal corresponding to the voltage written into the photoelectric conversion unit. Steps S1420 and S1430 may be reversed in order.

Next, in step S1440, it is determined whether an expected output value from the failure detection pixel matches an actual output value from the failure detection pixel. As a result of determination in step S1440, if the expected output value matches the actual output value (YES in step S1440), the processing proceeds to step S1450. In step S1450, it is determined that the image capturing operation is normally performed, and then the processing proceeds to step S1460. In step S1460, a pixel signal in a scanned row is transmitted to the memory 1305 and is primarily stored in the memory 1305. After that, the processing returns to step S1420 to continue the failure detection operation. If the expected output value does not match the actual output value (NO in step S1440) as a result of determination in step S1440, the processing proceeds to step S1470. In step S1470, it is determined that an abnormality has occurred in the image capturing operation, and an alarm is issued to the main control unit 1313 or the warning device 1312. The warning device 1312 causes a display unit to display information indicating that the abnormality is detected. After that, in step S1480, the operation of the photoelectric conversion apparatus 1302 is stopped and the operation of the photoelectric conversion system 1301 is terminated.

While the present exemplary embodiment illustrates an example where the processing in the flowchart is looped for each row, the processing in the flowchart may be looped for a plurality of rows, or the failure detection operation may be performed for each frame. In step S1470, an alarm may be issued to the outside of the vehicle via a wireless network.

While the present exemplary embodiment illustrates an example where a control operation for avoiding a collision with another vehicle, the present disclosure is also applicable to a control operation for automatic operation by following another vehicle, a control operation for automatic operation so as to prevent the vehicle from deviating from traffic lanes, and the like. Further, the application of the photoelectric conversion system 1301 is not limited to a vehicle. The photoelectric conversion system 1301 is also applicable to, for example, a moving body (moving apparatus), such as a ship, an aircraft, and an industrial robot. In addition, the application of the photoelectric conversion system 1301 is not limited to a moving body. The photoelectric conversion system 1301 is also applicable to devices that widely use object recognition, such as an intelligent transport system (ITS).

The photoelectric conversion apparatus according to the present exemplary embodiment may further include a color filter and a microlens, and may be configured to acquire various pieces of information, such as distance information. While an amplifier transistor is a part of a source follower circuit, the amplifier transistor may constitute a part of an analog-to-digital (A/D) converter. Specifically, the amplifier transistor may constitute a part of a comparator included in the A/D converter. Further, the configuration of a part of the comparator may be provided on another semiconductor substrate.

The present disclosure is not limited to the exemplary embodiments described above and can be modified in various ways. For example, an example where a configuration of any of the exemplary embodiments described above is partially added to other exemplary embodiments, and an example where a configuration of any of the exemplary embodiments described above are partially replaced by a configuration of other exemplary embodiments are also effective as exemplary embodiments of the present disclosure. The above-described exemplary embodiments are merely exemplary embodiments for carrying out the present disclosure, and the technical scope of the present disclosure should not be construed as limited to the above-described exemplary embodiments. That is, the present disclosure can be carried out in various modes without departing from the technical idea of the present disclosure or the principal features of the present disclosure.

According to an aspect of the present disclosure, it is possible to obtain accurate signal information in which the linearity of photoelectric conversion characteristics is maintained, while reducing or preventing an increase in power consumption in a photoelectric conversion apparatus even in a high illuminance state.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-133789, filed Jul. 19, 2019, which is hereby incorporated by reference herein in its entirety.

What is claimed is:

1. A photoelectric conversion apparatus comprising:
an avalanche diode;
a detection circuit configured to output a signal based on an avalanche current generated by avalanche multiplication in the avalanche diode;
a counter configured to count the number of generation times of the avalanche current detected by the detection circuit;
a switch disposed between an output node of the avalanche diode and the counter;
a reset circuit configured to reset a node between the switch and the detection circuit; and
a second reset circuit configured to reset the output node of the avalanche diode,
wherein a transistor constituting the switch and a transistor constituting the reset circuit have opposite conductivity types,
wherein a gate of the reset circuit is not connected to an output node of the detection circuit,
wherein the reset circuit resets the node during a period in which the switch is in an off state, and
wherein a response time of the second reset circuit is longer than Td, where Td represents an interval between a falling edge and a rising edge of a potential input to the detection circuit when a threshold voltage of the detection circuit is passed through.

2. The photoelectric conversion apparatus according to claim 1,
wherein the detection circuit is an inverter,
wherein an output node of the inverter is connected to a second inverter, and
wherein an output node of the second inverter is connected to each of the switch and the reset circuit.

3. The photoelectric conversion apparatus according to claim 1,
wherein the reset circuit is connected to an output node of the avalanche diode via the switch, and
wherein the reset circuit functions as a quench element during a period in which the switch is in an on state.

4. The photoelectric conversion apparatus according to claim 1, wherein turning on and off of the switch is controlled by a clock pulse to be periodically input.

5. The photoelectric conversion apparatus according to claim 4, wherein the reset circuit resets the node in response to input of the clock pulse.

6. The photoelectric conversion apparatus according to claim 5, wherein the clock pulse is simultaneously input to the switch and the reset circuit.

7. The photoelectric conversion apparatus according to claim 5, wherein the reset circuit is turned on after the switch is turned off, and the switch is turned on after the reset circuit is turned off.

8. The photoelectric conversion apparatus according to claim 5, wherein the clock pulse has a frequency of 1/Td, where Td represents an interval between a falling edge and a rising edge of a potential input to the detection circuit when a threshold voltage of the detection circuit is passed through.

9. The photoelectric conversion apparatus according to claim 5, wherein the reset circuit resets the node in a case where a period in which a potential of the output node of the avalanche diode exceeds a threshold for the detection circuit exceeds a predetermined time.

10. The photoelectric conversion apparatus according to claim 1,
wherein the switch is disposed between the second reset circuit and the detection circuit.

11. The photoelectric conversion apparatus according to claim 1,
wherein a plurality of photoelectric conversion circuits each including the avalanche diode, the detection circuit, and the switch is two-dimensionally arranged, and
wherein the plurality of photoelectric conversion circuits is configured to individually control turning on and off of each of the reset circuit and the switch.

12. The photoelectric conversion apparatus according to claim 1, further comprising a first substrate and a second substrate stacked on the first substrate,
wherein the first substrate includes the detection circuit, and
wherein the second substrate includes the avalanche diode.

13. A photoelectric conversion system comprising:
a photoelectric conversion apparatus according to claim 1; and
a signal processing circuit configured to process a signal output from the photoelectric conversion apparatus.

14. A moving body comprising:
a photoelectric conversion apparatus according to claim 1; and
a distance information acquisition circuit configured to acquire distance information from parallax information based on a signal output from the photoelectric conversion apparatus, the distance information indicating a distance from an object,
wherein the moving body further comprises a control circuit configured to control the moving body based on the distance information.

* * * * *